United States Patent
Teng et al.

(10) Patent No.: US 10,163,797 B2
(45) Date of Patent: Dec. 25, 2018

(54) FORMING INTERLAYER DIELECTRIC MATERIAL BY SPIN-ON METAL OXIDE DEPOSITION

(71) Applicant: TAIWAN SEMICONDUCTOR MANUFACTURING COMPANY, LTD., Hsin-Chu (TW)

(72) Inventors: Chi-Lin Teng, Taichung (TW); Jung-Hsun Tsai, Hsin-Chu (TW); Kai-Fang Cheng, Taoyuan (TW); Hsin-Yen Huang, Yonghe (TW); Hai-Ching Chen, Hsinchu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/879,259

(22) Filed: Oct. 9, 2015

(65) Prior Publication Data
US 2017/0103949 A1   Apr. 13, 2017

(51) Int. Cl.
*H01L 23/532*   (2006.01)
*H01L 21/768*   (2006.01)
(Continued)

(52) U.S. Cl.
CPC ........ *H01L 23/5329* (2013.01); *H01L 21/283* (2013.01); *H01L 21/31* (2013.01);
(Continued)

(58) Field of Classification Search
CPC ....... H01L 21/823475; H01L 21/02282; H01L 21/76897; H01L 21/7684; H01L 21/022; H01L 21/02175; H01L 21/02172; H01L 21/76801; H01L 21/76804; H01L 21/76802; H01L 29/41789; H01L 29/41783
See application file for complete search history.

(56) References Cited

U.S. PATENT DOCUMENTS 7,667,271 B2   2/2010   Yu et al.
7,910,453 B2   3/2011   Xu et al.
(Continued)

OTHER PUBLICATIONS

Scriven, L. E. "Physics and applications of dip coating and spin coating." MRS Online Proceedings Library Archive 121 (1988).*

*Primary Examiner* — Daniel Luke
(74) *Attorney, Agent, or Firm* — Haynes and Boone, LLP

(57) ABSTRACT

A plurality of high-k metal gate (HKMG) structures is formed over a substrate. The (HKMG) structures are separated by a plurality of gaps. The HKMG structures each include a first dielectric layer at an upper surface of the HKMG structure. The gaps are filled with a first conductive material. A portion of the first conductive material is removed in each of the gaps through an etching-back process. A metal oxide layer is formed using a spin-on deposition process. The metal oxide layer is formed over the (HKMG) structures and over the first conductive material. A second dielectric layer is formed over the metal oxide layer. An opening is etched in the second dielectric layer. The opening is etched through the second dielectric layer and through the metal oxide layer. The opening is filled with a second conductive material.

20 Claims, 19 Drawing Sheets

(51) Int. Cl.

| | |
|---|---|
| *H01L 29/417* | (2006.01) |
| *H01L 21/8234* | (2006.01) |
| *H01L 21/283* | (2006.01) |
| *H01L 21/31* | (2006.01) |
| *H01L 21/311* | (2006.01) |
| *H01L 21/3205* | (2006.01) |
| *H01L 21/3213* | (2006.01) |
| *H01L 23/522* | (2006.01) |
| *H01L 23/528* | (2006.01) |
| *H01L 29/45* | (2006.01) |
| *H01L 29/51* | (2006.01) |
| *H01L 29/66* | (2006.01) |
| *H01L 23/485* | (2006.01) |
| *H01L 29/78* | (2006.01) |

(52) U.S. Cl.
CPC .. *H01L 21/31105* (2013.01); *H01L 21/32051* (2013.01); *H01L 21/32131* (2013.01); *H01L 21/32133* (2013.01); *H01L 21/76802* (2013.01); *H01L 21/76879* (2013.01); *H01L 21/76897* (2013.01); *H01L 21/823475* (2013.01); *H01L 23/485* (2013.01); *H01L 23/528* (2013.01); *H01L 23/5226* (2013.01); *H01L 29/41783* (2013.01); *H01L 29/45* (2013.01); *H01L 29/517* (2013.01); *H01L 29/518* (2013.01); *H01L 29/66477* (2013.01); *H01L 29/456* (2013.01); *H01L 29/78* (2013.01)

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,435,891 B2 | 5/2013 | Engel et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,570,573 B1* | 2/2017 | Fan | H01L 29/45 |
| 2002/0111006 A1* | 8/2002 | Wu | H01L 21/76895 438/612 |
| 2006/0240655 A1* | 10/2006 | Lee | H01L 21/02063 438/590 |
| 2009/0087625 A1* | 4/2009 | Fujikawa | B81C 1/00111 428/195.1 |
| 2013/0175629 A1* | 7/2013 | Chang | H01L 21/823475 257/368 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0252630 A1* | 9/2014 | Chang | H01L 23/528 257/763 |
| 2015/0171091 A1* | 6/2015 | Lytle | H01L 29/665 257/369 |
| 2015/0332962 A1* | 11/2015 | Chen | H01L 21/76819 257/288 |
| 2016/0104645 A1* | 4/2016 | Hung | H01L 21/823437 257/401 |
| 2016/0133623 A1* | 5/2016 | Xie | H01L 27/088 257/384 |
| 2016/0190287 A1* | 6/2016 | Hsu | H01L 21/31144 438/299 |
| 2018/0204760 A1* | 7/2018 | Chandhok | H01L 21/7682 |

* cited by examiner

FORMING INTERLAYER DIELECTRIC MATERIAL BY SPIN-ON METAL OXIDE DEPOSITION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, a multilayered interconnect structure may be formed. Among other things, the interconnect structure contains metal lines and vias/contacts to provide electrical connections to transistor elements such as gate, source, and drain. The metal lines and vias are electrically insulated from one another by an interlayer dielectric (ILD) material. Existing semiconductor fabrication technologies may use silicon oxycarbide to form a part of the ILD. However, using silicon oxycarbide to form the ILD may lead to trapped voids in the ILD as well as increased resistivity due to undesirable oxidation. Consequently, semiconductor device performance is degraded.

Therefore, while conventional methods and materials for forming the ILD have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
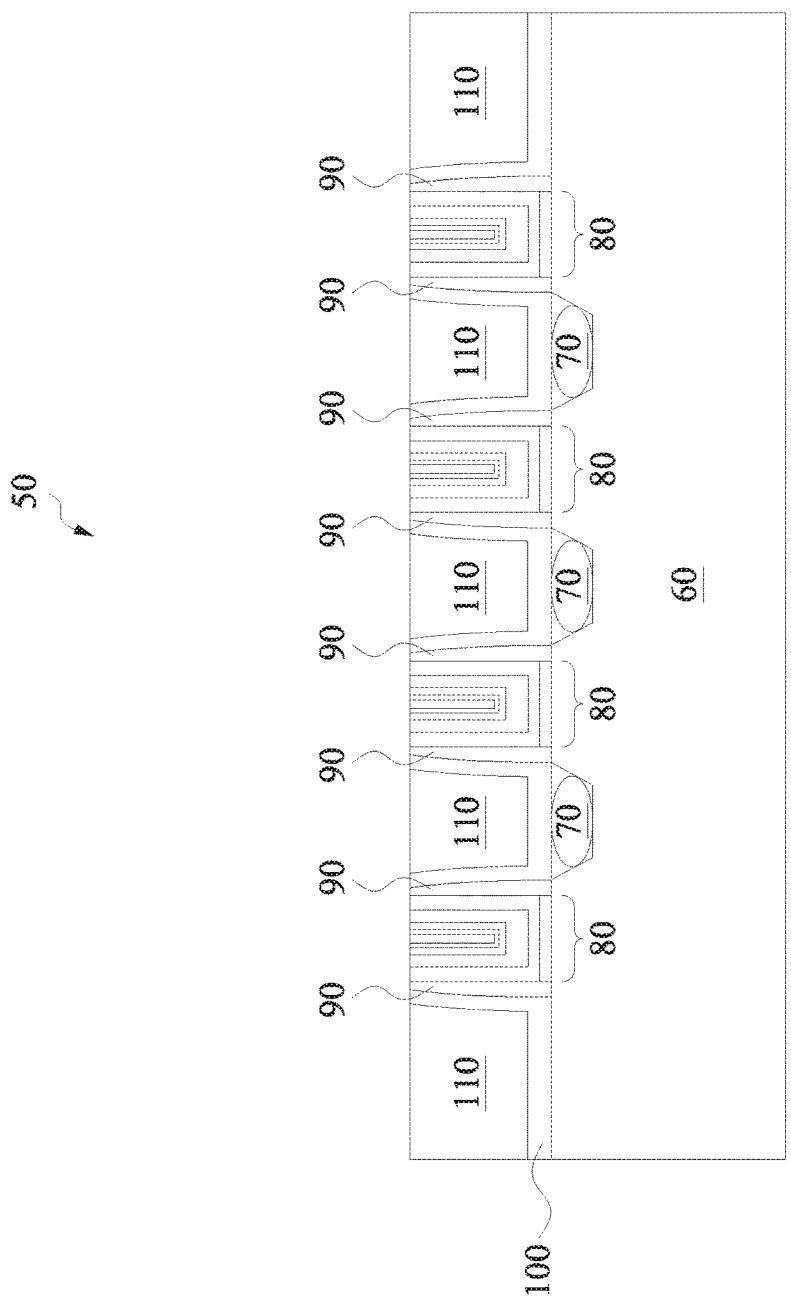
FIGS. 1-18 are diagrammatic cross-sectional side views of a semiconductor device at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As a part of semiconductor fabrication, electrical interconnections need to be formed to electrically interconnect the various microelectronic elements (e.g., source/drain, gate, etc.) of the semiconductor device. Generally, the electrical interconnections such as metal lines or vias are electrically insulated from one another by an interlayer dielectric (ILD) material. Conventional semiconductor fabrication technologies have employed silicon oxycarbide (SiOC) as the material for the ILD. However, the use of SiOC as the ILD material may lead to several problems. For example, the SiOC material is formed using a chemical vapor deposition (CVD) or atomic layer deposition (ALD) process. As the semiconductor scaling down process continues (e.g., less than the 5 nanometer technology node), these processes may not have adequate gap filling performance. Consequently, voids may be formed within the ILD layer, which degrades semiconductor device performance. In addition, the formation of the SiOC material also involves an oxygen-containing gas. The oxygen may oxidize a metal layer below (referred to as an oxygen attack), and this may lead to increased resistivity, which is also undesirable. Furthermore, the formation of SiOC may suffer from other problems such as reduced process window due to limited etching selectivity and increased costs due to the many steps (such as polishing/planarization processes) required to form the SiOC layer. These problems may be exacerbated as the device sizes become smaller and smaller.

To address these problems discussed above with using SiOC to form the ILD, the present disclosure proposes using a spin-on metal oxide deposition process to form a part of the ILD. The various aspects of the present disclosure will now be discussed in more detail with reference to FIGS. 1-19. The embodiments herein are discussed using in a N5 (5-nanometer technology node) mid-end-of-line (MEOL) flow.

FIGS. 1-18 are diagrammatic fragmentary cross-sectional side views of a semiconductor device 50 at various stages of fabrication in accordance with various aspects of the present disclosure. In the illustrated embodiment, the semiconductor device 50 is fabricated under a semiconductor technology node that is 5-nanometers or lower. The semiconductor device 50 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

The semiconductor device 50 includes a substrate 60. In some embodiments, the substrate 60 is a silicon substrate doped with a p-type dopant such as boron (for example a p-type substrate). Alternatively, the substrate 60 could be another suitable semiconductor material. For example, the substrate 60 may be a silicon substrate that is doped with an n-type dopant such as phosphorous or arsenic (an n-type substrate). The substrate 60 could include other elementary semiconductors such as germanium and diamond. The substrate 60 could optionally include a compound semiconductor and/or an alloy semiconductor. Further, the substrate 60 could include an epitaxial layer (epi layer), may be strained for performance enhancement, and may include a silicon-on-insulator (SOI) structure.

A plurality of doped regions is formed in the substrate 60. For example, a plurality of source/drains 70 of transistors is formed in the substrate 60. In some embodiments, these source/drains 70 may be formed by one or more ion implantation processes. Dielectric isolation structures such as shallow trench isolation (STI) or deep trench isolation (DTI) are also formed in the substrate 60, but they are not specifically illustrated herein for reasons of simplicity.

A plurality of gate structures 80 are formed over the substrate 60. In the illustrated embodiment, the gate structures 80 are high-k metal gate (HKMG) structures. Unlike conventional gate structures having a polysilicon gate electrode, a HKMG structure has a gate electrode that contains metal materials. For example, in some embodiments, the metal gate electrode may include work function metals such as titanium nitride (TiN), tungsten (W), tungsten nitride (WN), or tungsten aluminum (WAl). The metal gate electrode may also include aluminum (Al), Titanium (Ti), tungsten (W), or copper (Cu) as the fill metal.

Also unlike conventional gate structures having a silicon oxide gate dielectric, a HKMG structure has a high-k gate dielectric. A high-k dielectric material is a material having a dielectric constant that is greater than a dielectric constant of SiO2, which is approximately 4. In some embodiments, the gate dielectric of the HKMG structure may include includes hafnium oxide (HfO2), which has a dielectric constant that is in a range from approximately 18 to approximately 40, or ZrO2, Y2O3, La2O5, Gd2O5, TiO2, Ta2O5, HfErO, HfLaO, HfYO, HfGdO, HfAlO, HfZrO, HfTiO, HfTaO, or SrTiO in alternative embodiments.

The formation of the HKMG structures 80 may involve a gate replacement process, where a dummy gate electrode (and possibly a dummy gate dielectric as well) is formed first and then subsequently removed and replaced by the metal gate electrode (and possibly the high-k gate dielectric) later. As an example, the details of forming HKMG structures are described in detail in U.S. patent application Ser. No. 13/440,848, filed on Apr. 5, 2012, entitled "Cost-effective gate replacement process" to Zhu et al., which is issued as U.S. Pat. No. 8,753,931 on Jun. 17, 2014, the disclosure of which is hereby incorporated by reference in its entirety.

Gate spacers 90 are disposed on the sidewalls of the gate structures 80. The gate spacers may contain a suitable dielectric material. In the illustrated embodiment, the gate spacers 90 contain SiOC. In alternative embodiments, the gate spacers 90 may include other suitable dielectric materials such as silicon oxide, silicon carbide, silicon oxynitride, or combinations thereof.

An ILD layer 100 is disposed over the substrate 60 and on the sidewalls of the gate spacers 90. In the illustrated embodiment, the ILD layer 100 contains SiOC. In alternative embodiments, the ILD layer 100 may include another suitable low-k dielectric material. An ILD layer 110 is disposed over the ILD layer 100. In the illustrated embodiment, the ILD layer 110 contains silicon oxide. At the stage of fabrication shown in FIG. 1, a planarization process such as a chemical mechanical polishing (CMP) process has been performed to flatten and planarize the surfaces of the ILD layer 110 and the HKMG structures 80.

Figure 2:
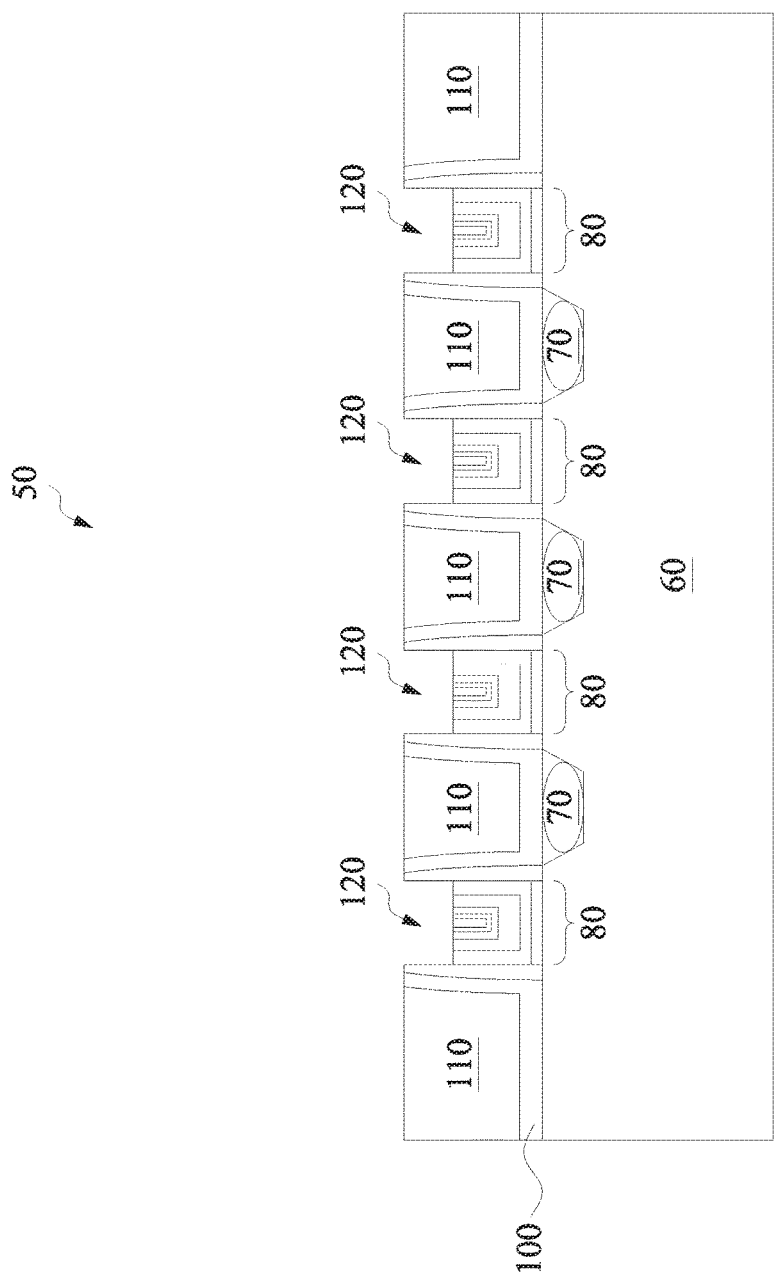

Referring now to FIG. 2, the gate structures 80 are etched back. In other words, a portion of each of the HKMG structures 80 is removed by an etch-back process, thus forming openings or trenches 120 above the HKMG structures 80.

Figure 3:
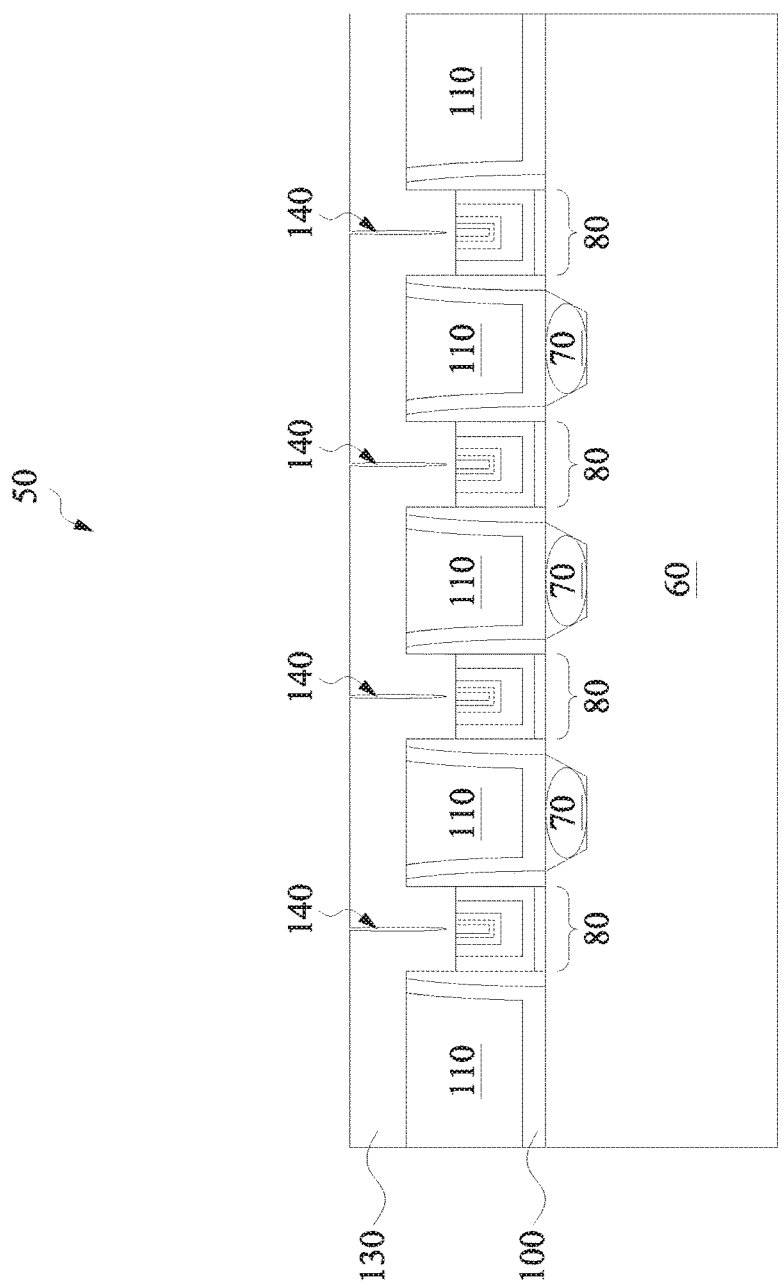

Referring now to FIG. 3, a dielectric layer 130 is formed over the ILD layer 110 and over the HKMG structures 80. The dielectric layer 130 is also formed in the openings 120. The formation of the dielectric layer 130 may also be referred to as a refill process. In the illustrated embodiment, the dielectric layer 130 contains silicon nitride. The silicon nitride is formed by an atomic layer deposition (ALD) process, which is conformal. The conformal ALD process may lead to seams 140 in portions of the dielectric layer 130 formed above the HKMG structures 80.

Figure 4:
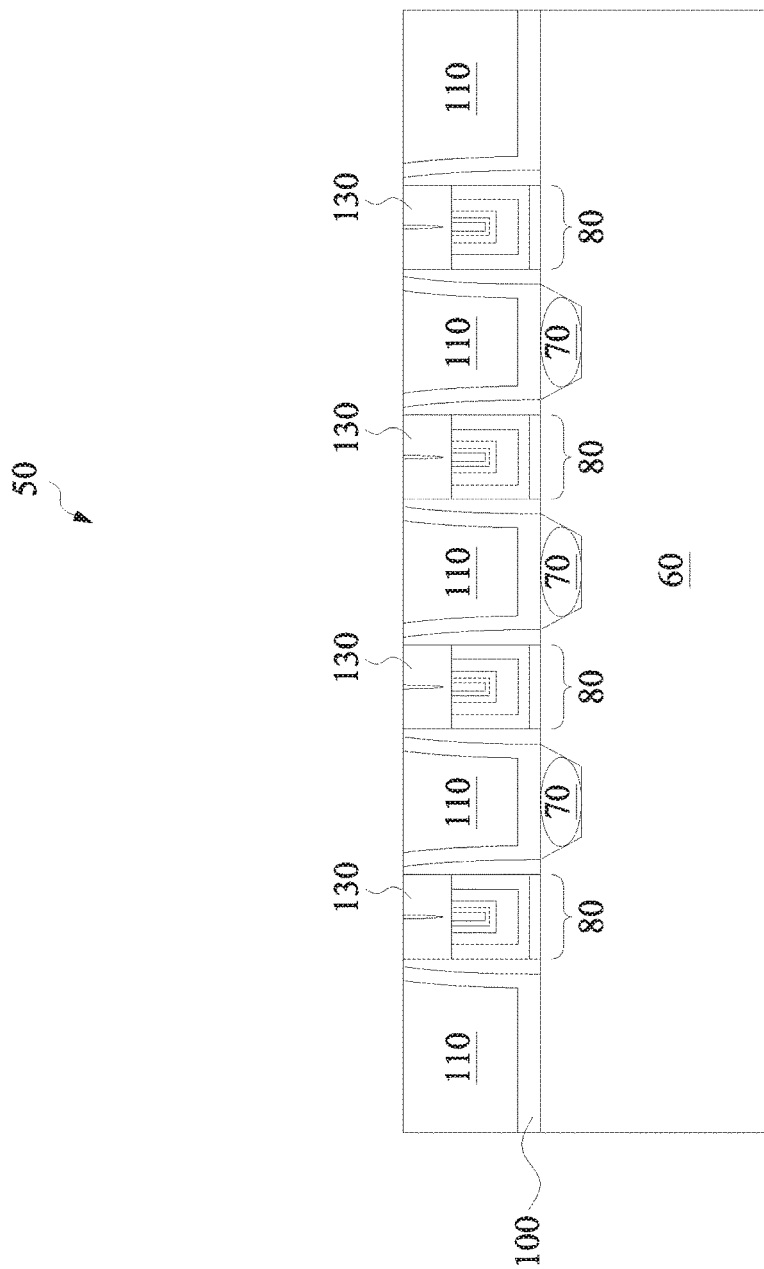

Referring now to FIG. 4, a planarization/polishing process such as a CMP process is performed to the dielectric layer 130. As a result of the CMP process, a portion of the dielectric layer 130 is removed, and the remaining portion of the dielectric layer 130 has a substantially flat or planar surface, though the seams 140 may still be present at this point.

Figure 5:
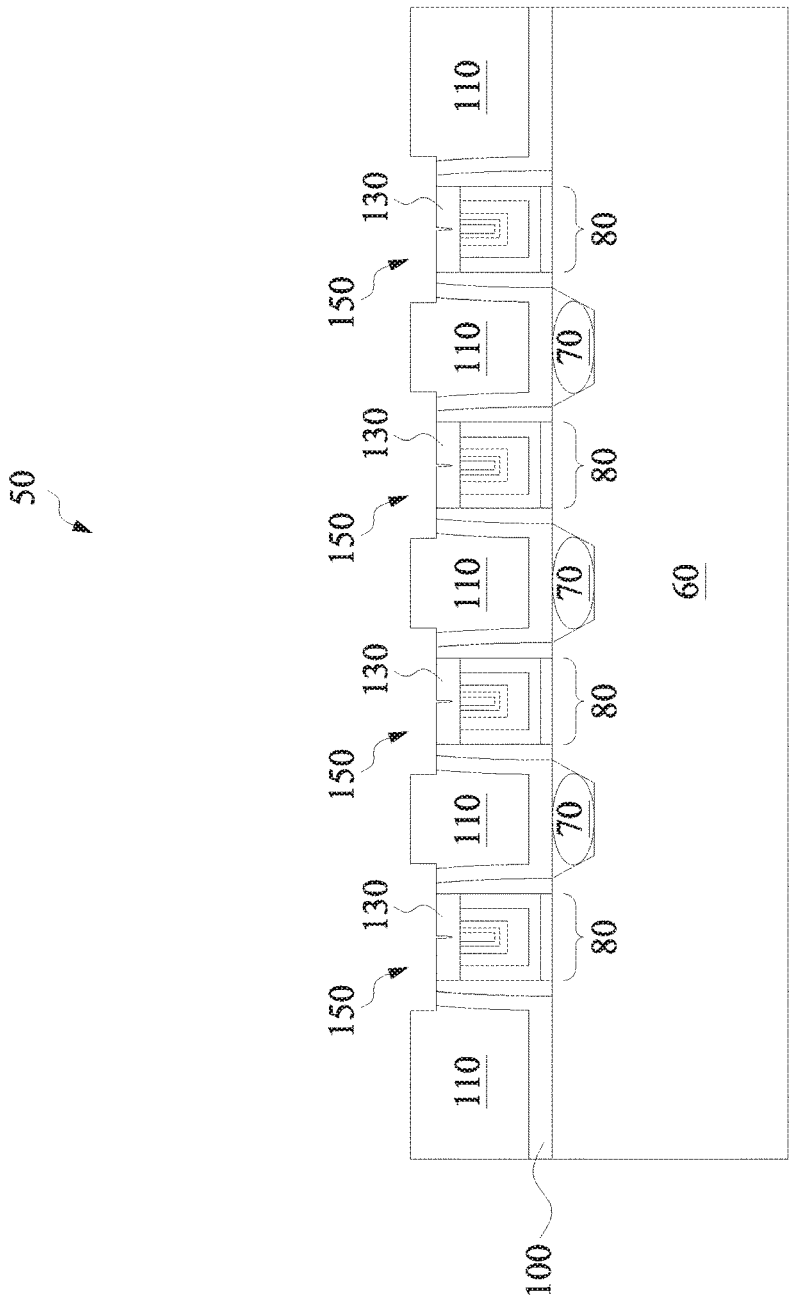

Referring now to FIG. 5, one or more etching processes are performed to remove a portion of the dielectric layer 130 disposed over each HKMG structure 80. Portions of the gate spacers 90, the ILD layer 100, and the ILD layer 110 are also removed. As a result, openings 150 are formed over the HKMG structures 80.

Figure 6:
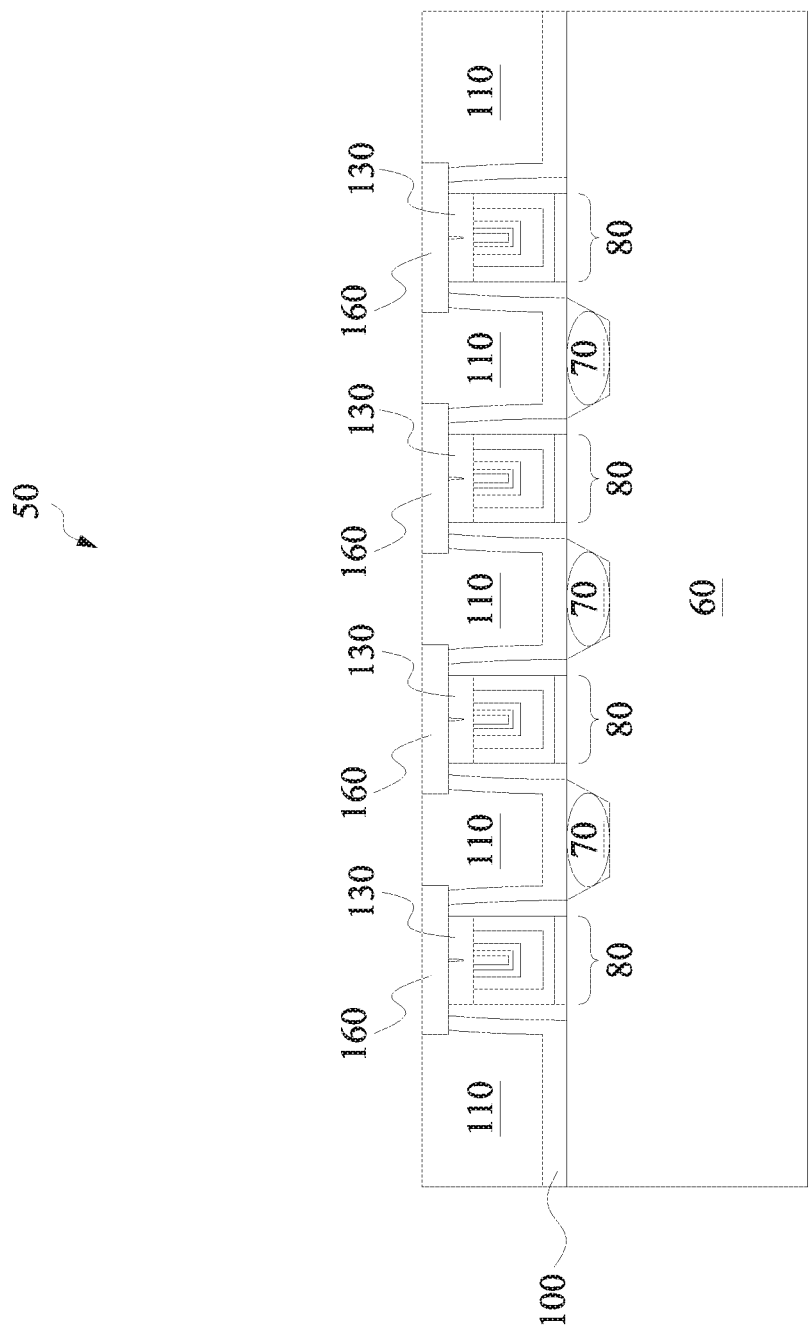

Referring now to FIG. 6, an amorphous silicon layer 160 is formed in each of the openings 150. In other words, the amorphous silicon layer 160 is formed on the dielectric layer 130 (and on portions of the gate spacers 90 and the ILD layer 100). The amorphous silicon layer 160 may be formed by depositing an amorphous silicon material over the dielectric layer 130 and over the ILD layer 110 and performing a CMP process to the deposited amorphous silicon material until the amorphous silicon material is coplanar with the ILD layer 110.

Figure 7:
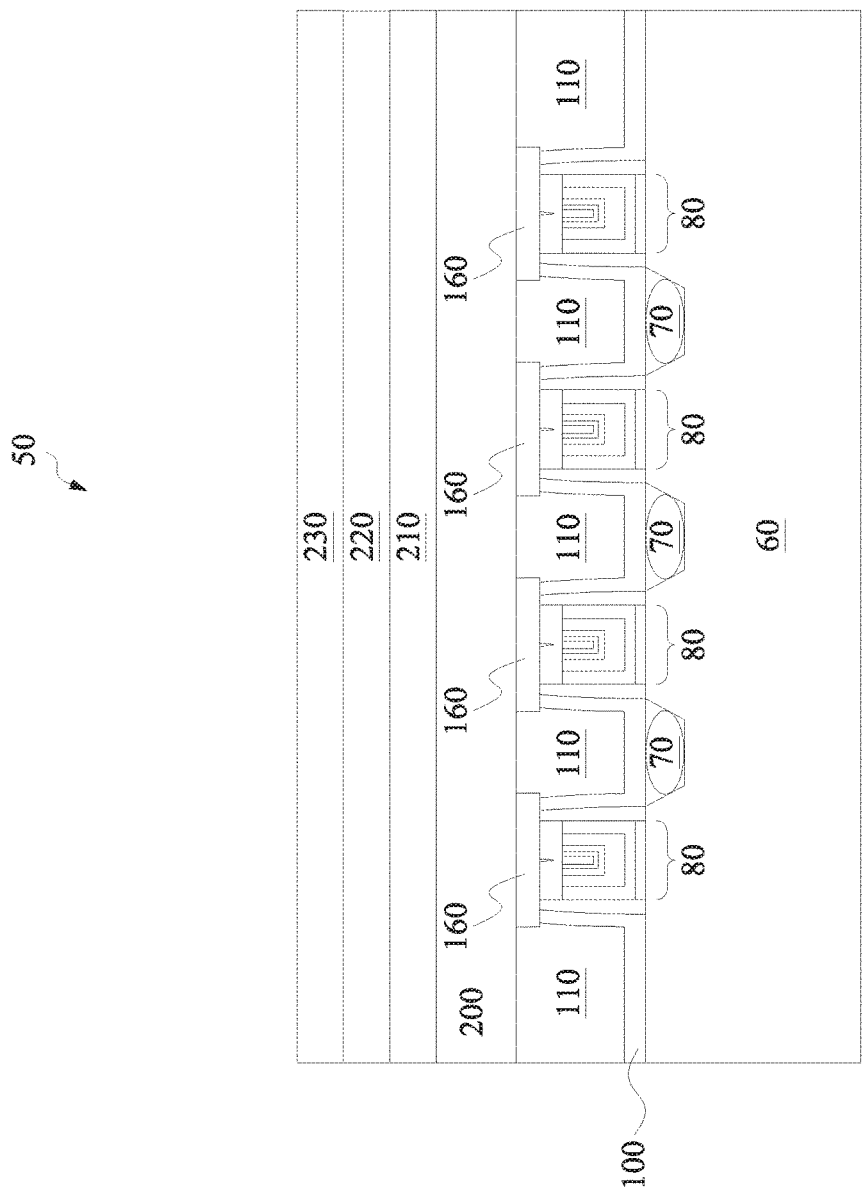

Referring now to FIG. 7, an ILD layer 200 is formed over the ILD layer 110 and over the amorphous silicon layer 160. The ILD layer 200 may contain a low-k dielectric material. A hard mask layer 210 is formed over the ILD layer 200. The hard mask layer 210 may contain titanium nitride in some embodiments. A dielectric layer 220 is formed over the hard mask layer 210. The dielectric layer 220 may contain silicon oxide in some embodiments. An amorphous silicon layer 230 is then formed over the dielectric layer 220. These layers 210-230 are used for patterning purposes.

Figure 8:
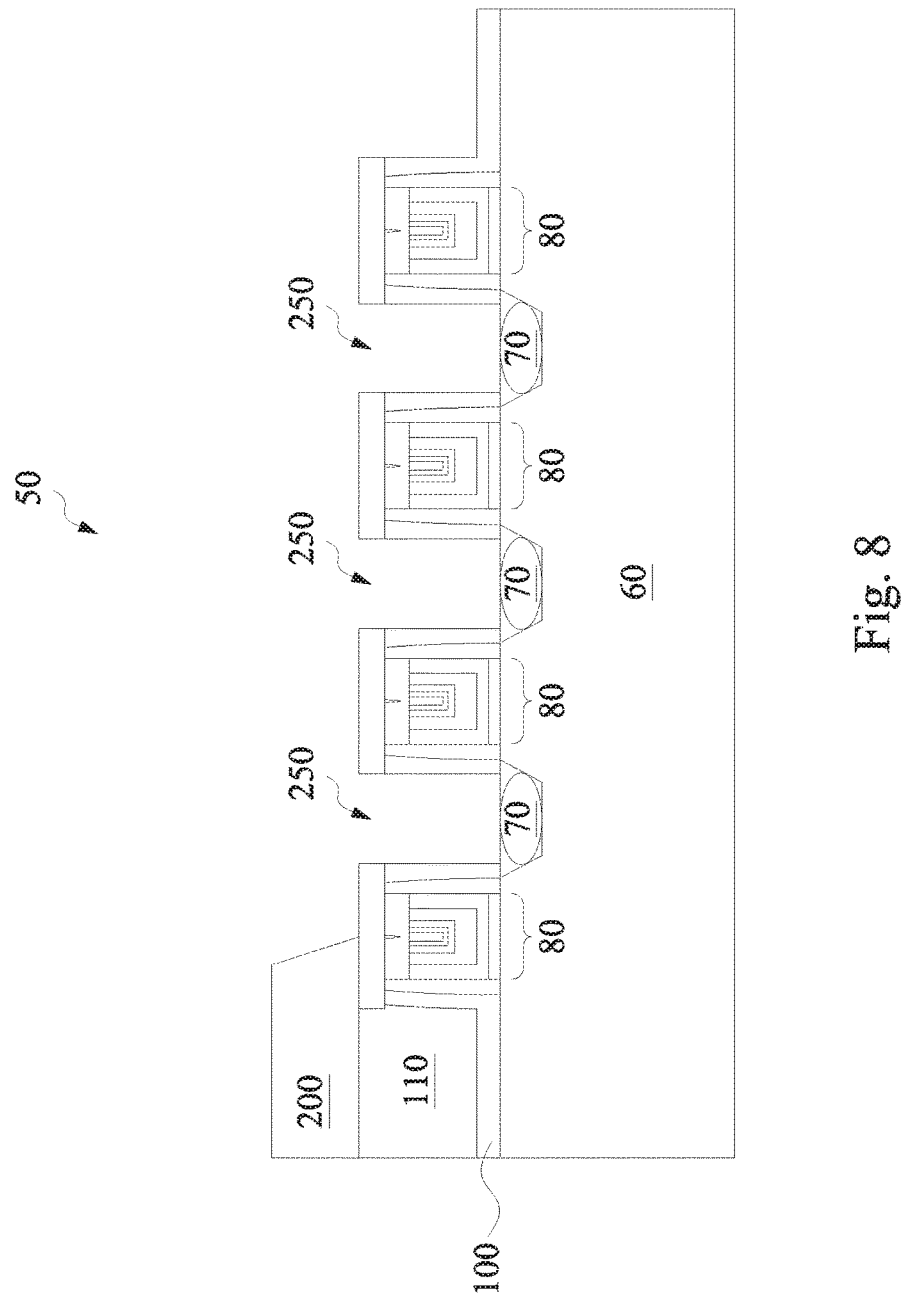

Referring now to FIG. 8, a patterning process is performed to remove the ILD layer 110 disposed between the adjacent HKMG structures 80, as well as to remove the portions of the layer 100 disposed below the removed ILD layer 110. As a result, gaps 250 are formed between adjacent HKMG structures 80. In other words, the HKMG structures 80 are separated from one another by at least the gaps 250. The amorphous silicon layer 160 still remains. The source/drains 70 are exposed by the gaps 250, and conductive contacts will be formed on one or more of the source/drains 70 in a later process so as to provide electrical interconnection to the source/drains 70. The hard mask layer 210, the dielectric layer 220, and the amorphous silicon layer 230 may be removed thereafter.

Figure 9:
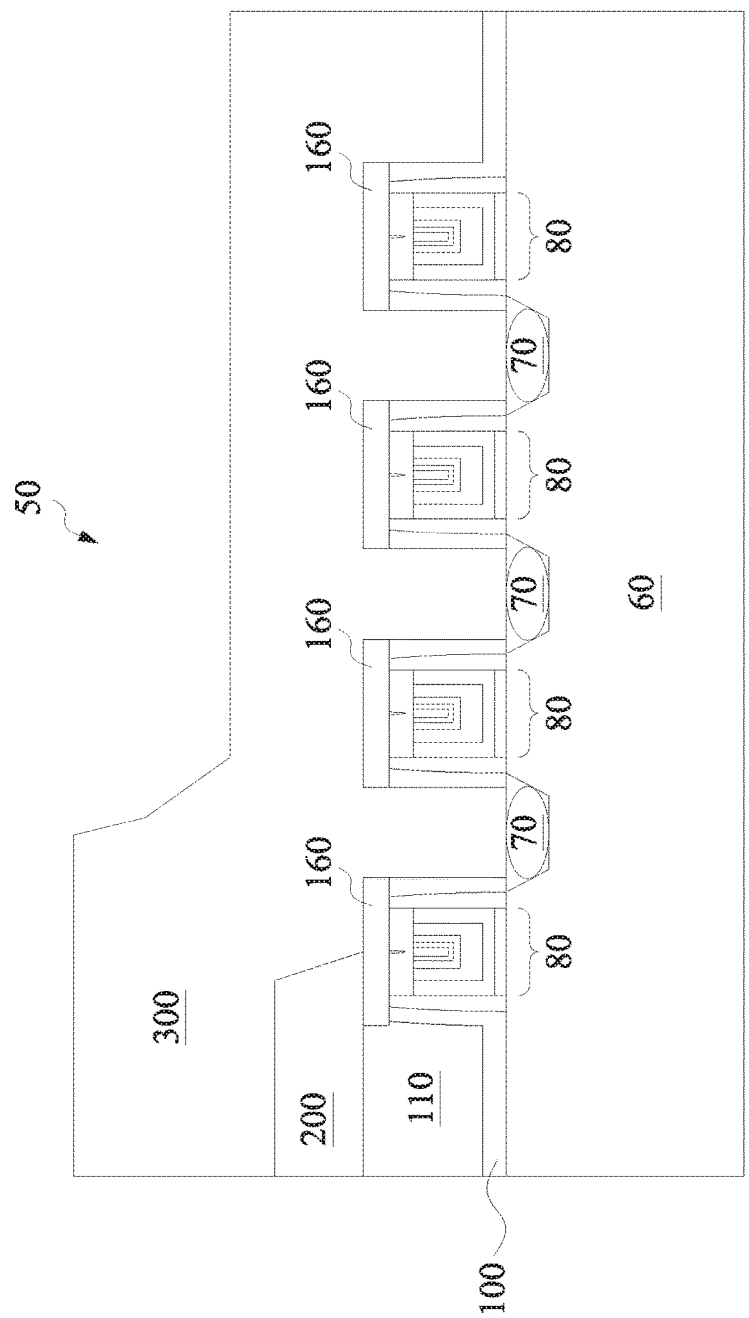

Referring now to FIG. 9, a conductive material 300 is formed over the HKMG structures 80. The conductive material 300 may be formed by a suitable deposition process. The conductive material 300 fills the gaps 250. Thus, the conductive material 300 is in electrical and physical contact with the source/drains 70. In some embodiments, the conductive material 300 contains cobalt. In some other embodiments, the conductive material 300 may contain tungsten or ruthenium.

Figure 10:
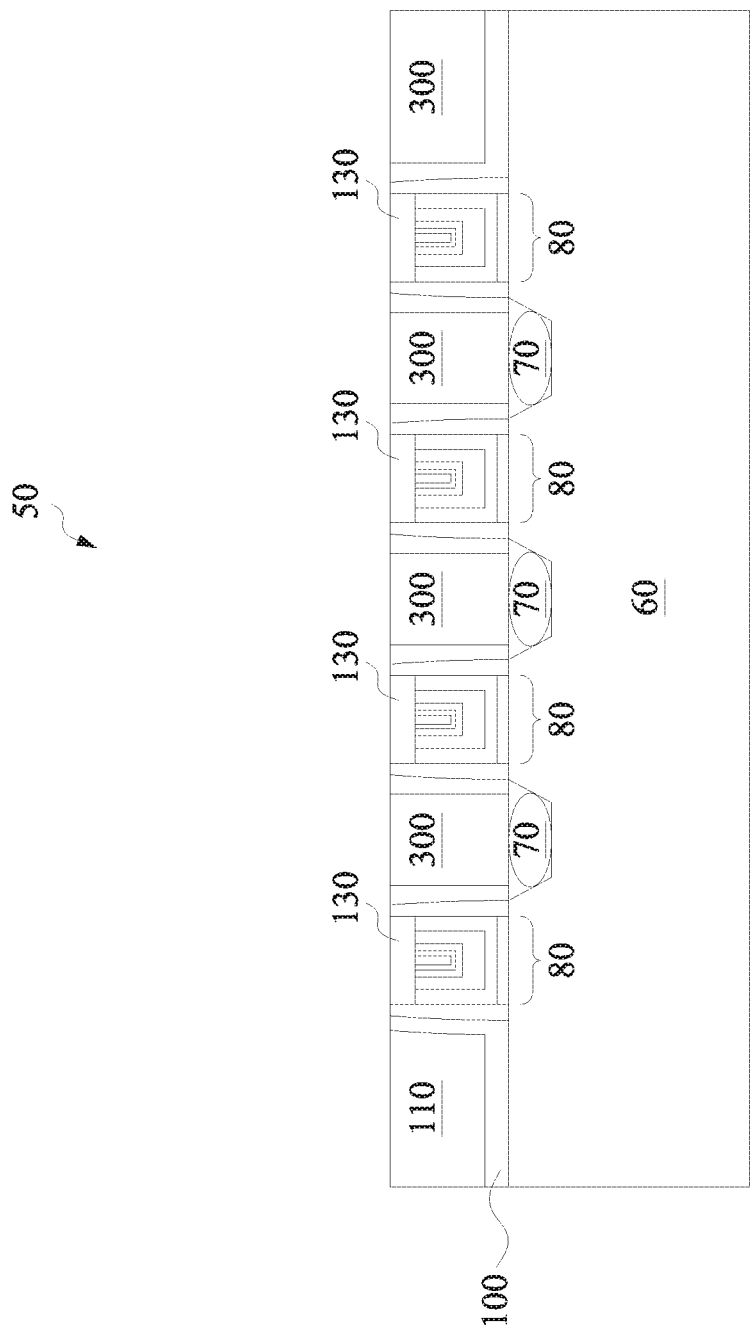

Referring now to FIG. 10, a polishing/planarization process such as a CMP process is performed to the conductive material 300. In addition to removing a portion of the conductive material 300, the CMP process also removes the amorphous silicon layer 160 and the ILD layer 200 (as well as a portion of the ILD layer 110). At the end of the CMP process, the surfaces of the portions of the conductive material 300 filling the gaps 250 are coplanar with the surfaces of the ILD layer 110 and the dielectric layer 130 disposed over the HKMG structures 80. The seams that were previously present in the layer 130 are mostly removed at this point as well due to the polishing.

Figure 11:
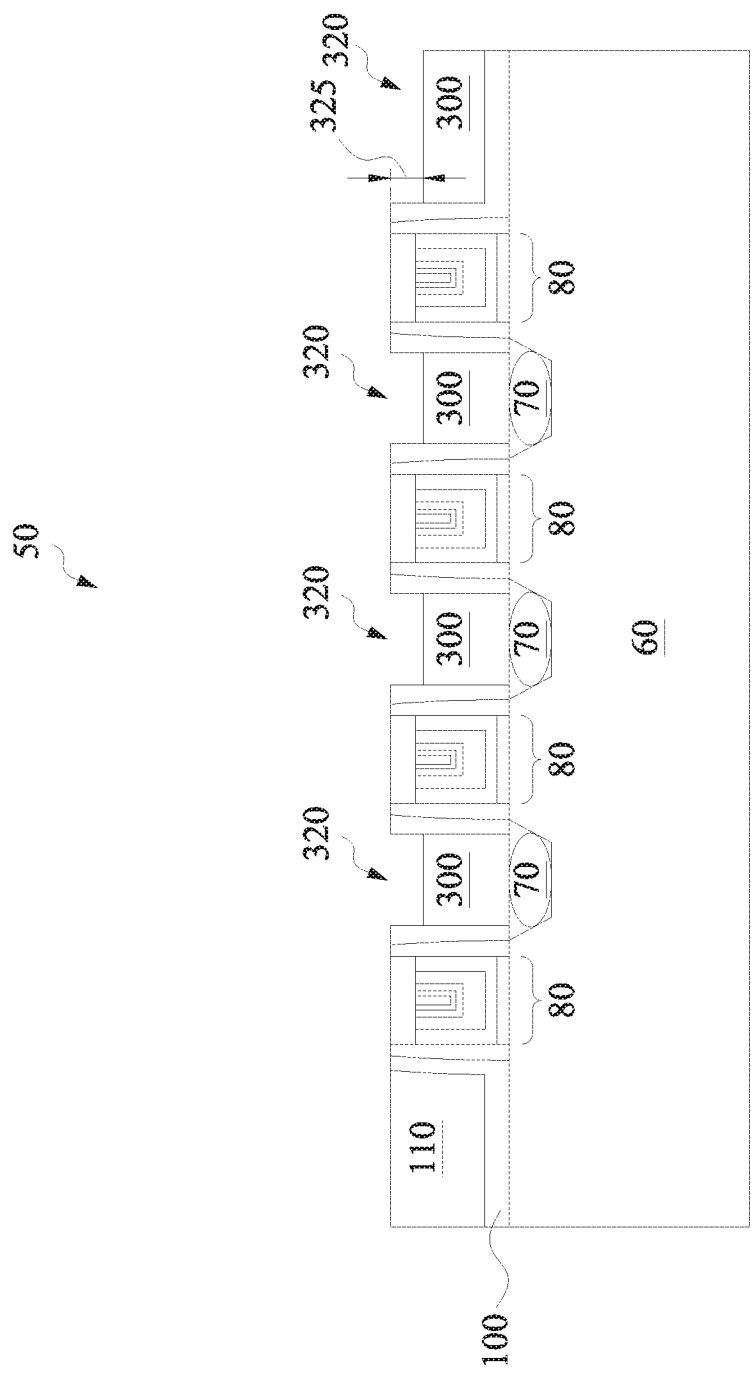

Referring now to FIG. 11, a portion of the conductive material 300 filled in each gap 250 is etched away. This may be referred to as a cobalt etch back process. The etching back process forms recesses 320 (or openings). In some embodiments, the etching back process has an etching depth 320 (i.e., the depth of the recesses 320) that is greater than about 100 angstroms. The etching back process is performed so as to prevent or reduce the likelihood of leakage. For example, if the conductive material 300 is not etched back, then a leakage path from the metal gate electrode of the HKMG structure 80 to a conductive (to be formed in a later process) will be shorter, which means current leakage would have been more likely to occur. Here, the etching depth 320 is configured to be sufficiently high (e.g., greater than about 100 angstroms) so as to minimize this leakage risk.

Figure 12:
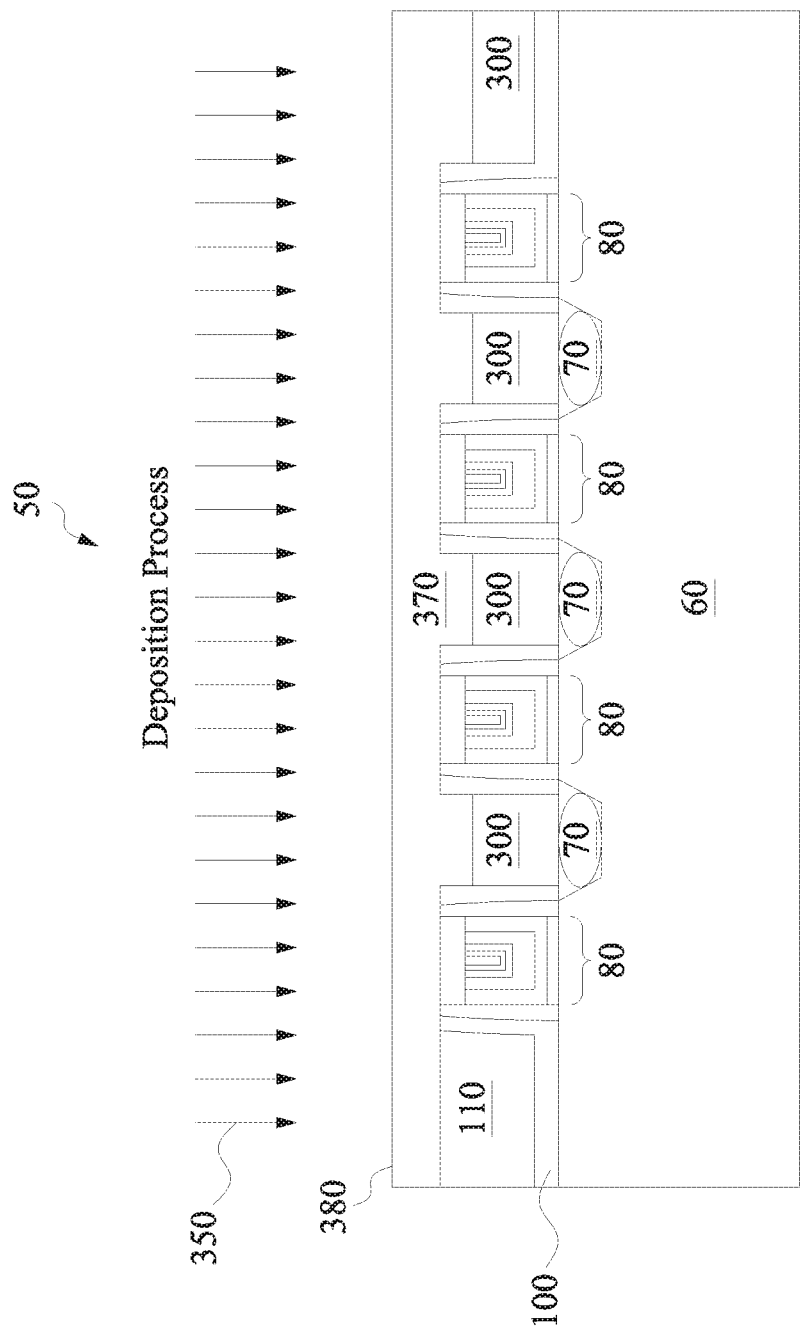

Referring now to FIG. 12, a deposition process 350 is performed to form a metal oxide layer 370 over the ILD layer 110, the HKMG structures 80, and the conductive material 300. The deposition process 350 is a spin-on deposition process. In some embodiments, the spin-on deposition process is performed with a spin that is in a range from about 500 revolutions-per-minute (RPM) to about 3000 RPM, and for a duration in a range from about 20 seconds to about 200 seconds. The deposition process 350 may also include a post-baking (i.e., after the material 370 has been spin-deposited) process with either air or N2, which is performed with a temperature in a range from about 50 degrees Celsius to about 400 degrees Celsius. These process conditions are performed to ensure that the formed metal oxide layer 370 has the desired thickness and quality. In some embodiments, the desired thickness is in a range from about 100 angstroms to about 1000 angstroms. It is understood that the spin-on deposition process does not involve the use of oxygen-containing gases.

In various embodiments, the metal oxide layer 370 may have the following material compositions: aluminum oxide, zirconium oxide, zinc oxide, tungsten oxide, tantalum oxide, titanium oxide, or hafnium oxide. In some embodiments, the metal oxide layer 370 has the following properties: a dielectric constant (k) that is greater than about 7; a leakage current in a range from about $10^{-10}$ to $10^{-13}$ amps/centimeter$^2$; and a dielectric breakdown (EBD) in a range from about 5-8 millivolts/centimeter.

The formation of the metal oxide layer 370 using the deposition process 350 offers advantages. For example, the spin-on deposition of the metal oxide material has good gap filling performance and ensures that no seams or voids will be formed in the metal oxide layer 370. In comparison, instead of forming the metal oxide layer 370 via the spin-on deposition of the deposition process 350, conventional methods typically form SiOC by a CVD or ALD process. The SiOC formed by the CVD or ALD processes may trap voids within the SiOC material. The trapped voids may make process control more difficult and may lead to reliability problems.

In addition, conventional CVD or ALD processes for forming the SiOC material may involve an oxygen-containing gas (e.g., an O2 gas or CO2 gas). The oxygen-containing gas may oxidize the conductive materials below (for example the conductive material 300) through a plasma reaction, thereby causing increased resistivity, which is undesirable for device performance. In comparison, the deposition process 350 herein is performed without using an oxygen-containing gas, thereby eliminating the risk of oxidizing the interface between the metal oxide layer 370 and the conductive materials 300.

Furthermore, in conventional fabrication processes, the surface topography variation of the SiOC layer may be too great for subsequent processing. Therefore, a polishing process such as a CMP process is typically performed on the SiOC layer after it is formed by CVD or ALD. The CMP process renders the SiOC layer flat, but it may also cause too much SiOC material to be removed. Consequently, another SiOC deposition is typically performed following the CMP process to ensure that the SiOC is sufficiently thick and has a flat surface. In other words, conventional methods of forming the SiOC layer may involve 3 separate steps: an initial SiOC deposition process, followed by a CMP process, followed by another SiOC deposition process. Having to perform 3 separate processes to form the SiOC layer is both expensive and more time-consuming.

In comparison, the present disclosure can form the metal oxide layer 370 in a single process—the deposition process 370 (using spin-on deposition). One advantage of the spin-on deposition is that a surface 380 of the metal oxide layer is sufficiently flat, such that it no longer requires a subsequent planarization process before additional layers can be formed thereon. In other words, the surface 380 of the metal oxide layer 370 is flatter (or has less surface topography variation) that the SiOC layer formed in conventional schemes, so that any subsequent CMP process is optional rather than necessary. Since no CMP process needs to be performed on the metal oxide layer 370, it will not lose any thickness either, and thus no additional deposition of the metal oxide material is needed either. In this manner, a single manufacturing process (i.e., the deposition process 350) herein effectively replaces 3 separate manufacturing processes in conventional fabrication involving SiOC formation.

Figure 13:
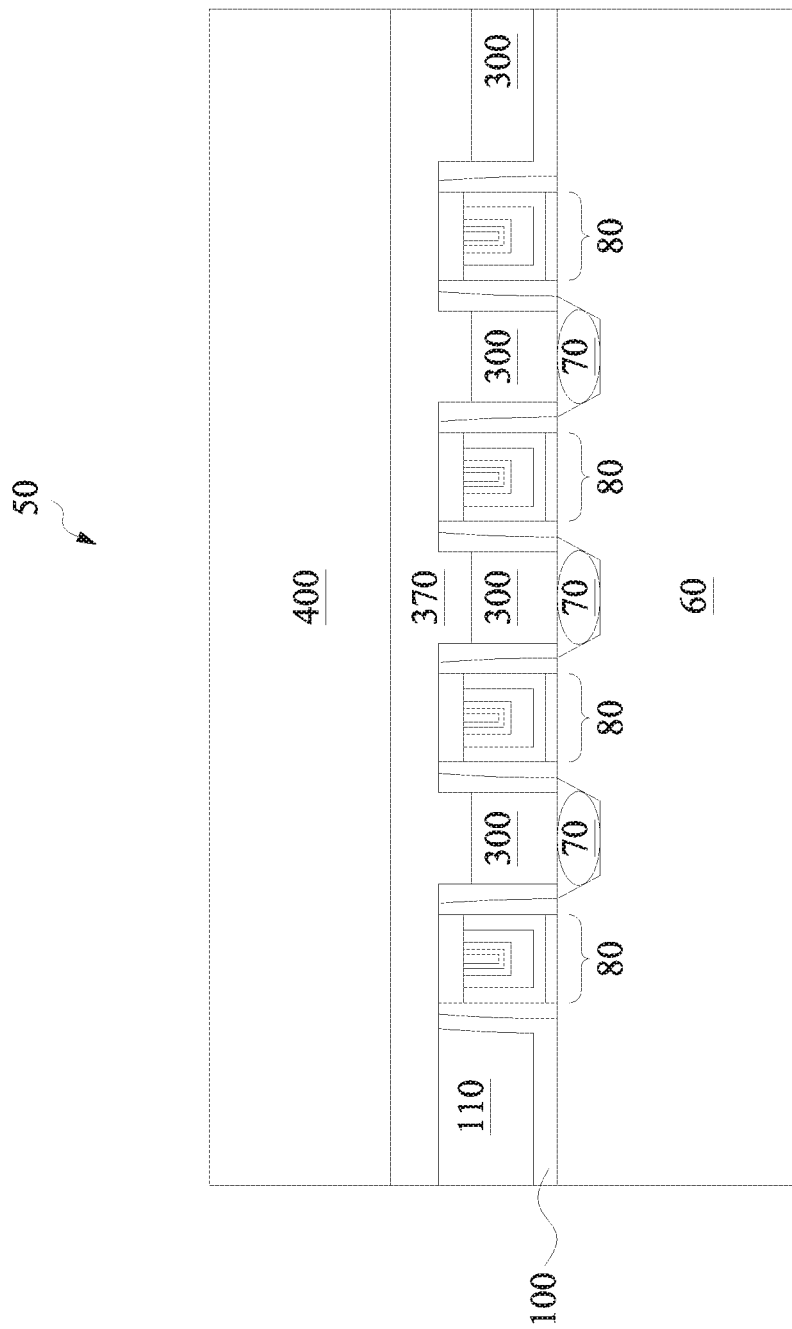

Referring now to FIG. 13, another ILD layer 400 is formed on the flat surface 380 of the metal oxide layer 370. The ILD layer 400 is formed by a suitable deposition process known in the art, for example a CVD process. The ILD layer 400 may contain a suitable dielectric material.

Figure 14:
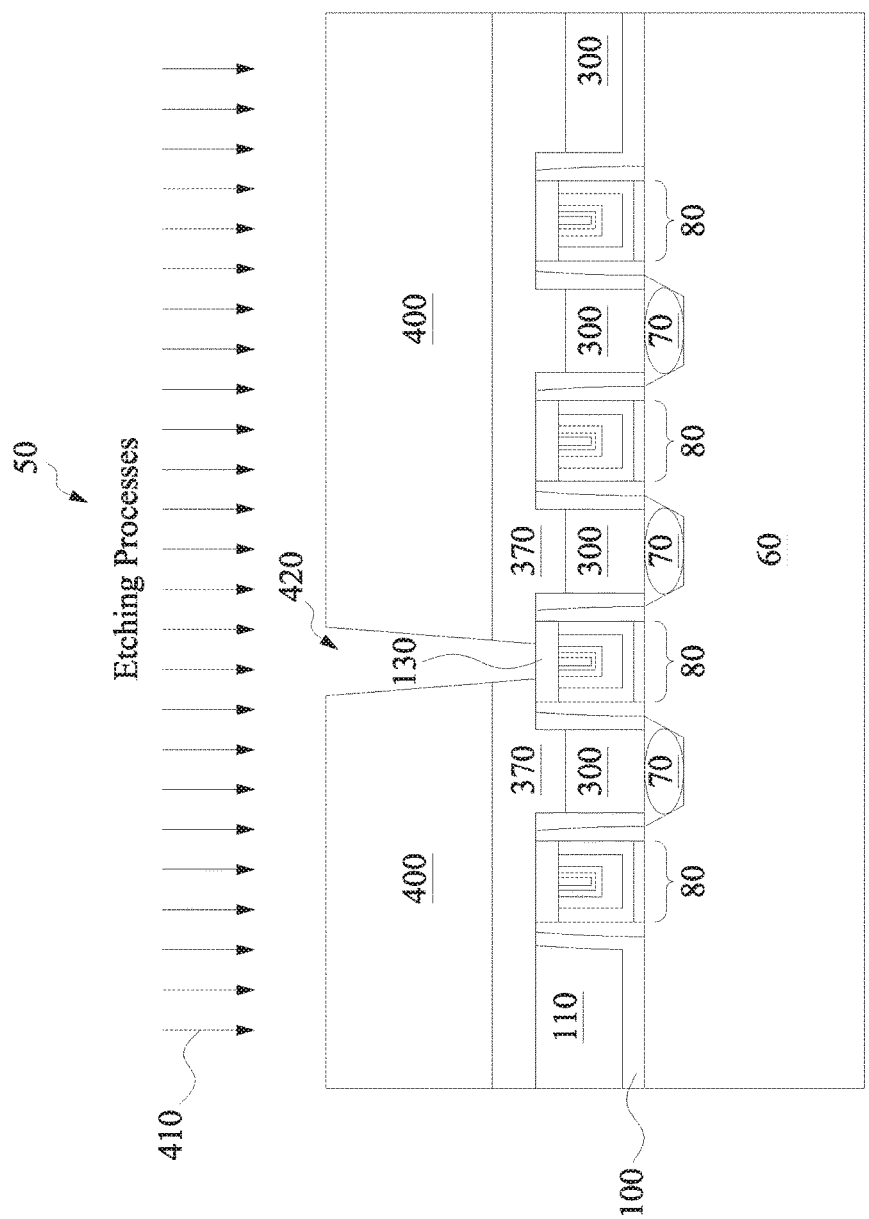

Referring now to FIG. 14, one or more etching processes 410 are performed to form an opening 420 over one of the gate structures 80. The opening 420 extends through the ILD layer 400 and through the metal oxide layer 370 but stops at the dielectric layer 130. Stated differently, the dielectric layer 130 serves as an etching-stop layer in this step of fabrication. This step of fabrication may also be referred to as a VG patterning step (i.e., for patterning a conductive via/contact for the gate).

It can be seen that another advantage of the present disclosure is that it enlarged the process window. Specifically, the process window is enlarged as a result of increased etching selectivity between the dielectric layer 130 and the metal oxide layer 370 (compared to the dielectric layer 130 and an SiOC layer in conventional processes). In more detail, as discussed above, the dielectric layer 130 contains silicon nitride. Had an SiOC layer been used instead of the metal oxide layer 370, the etching processes 420 would have to be configured such that there is sufficient etching selectivity between the silicon nitride material and the silicon oxycarbide material. In other words, the silicon nitride material and the silicon oxycarbide material would have to have substantially different etching rates, so that the silicon oxycarbide material can be etched away while the silicon nitride material remains substantially unetched. However, this may prove to be difficult, since silicon nitride and silicon oxycarbide both contain silicon, which means that it would have been difficult to configure the etching processes 420 to remove silicon oxycarbide without affecting silicon nitride.

In comparison, the present disclosure uses metal oxide to implement the layer 370. There is no element overlap between silicon nitride and metal oxide. As such, it is much easier to configure the etching processes 420 to remove the metal oxide material of the layer 370 without affecting the silicon nitride material of the layer 130. In other words, the etching selectivity between the metal oxide layer 370 and the dielectric layer 130 is improved, which allows for a greater process window. In some embodiments, the etching selectivity can be tuned to be 15:1 or higher.

Figure 15:
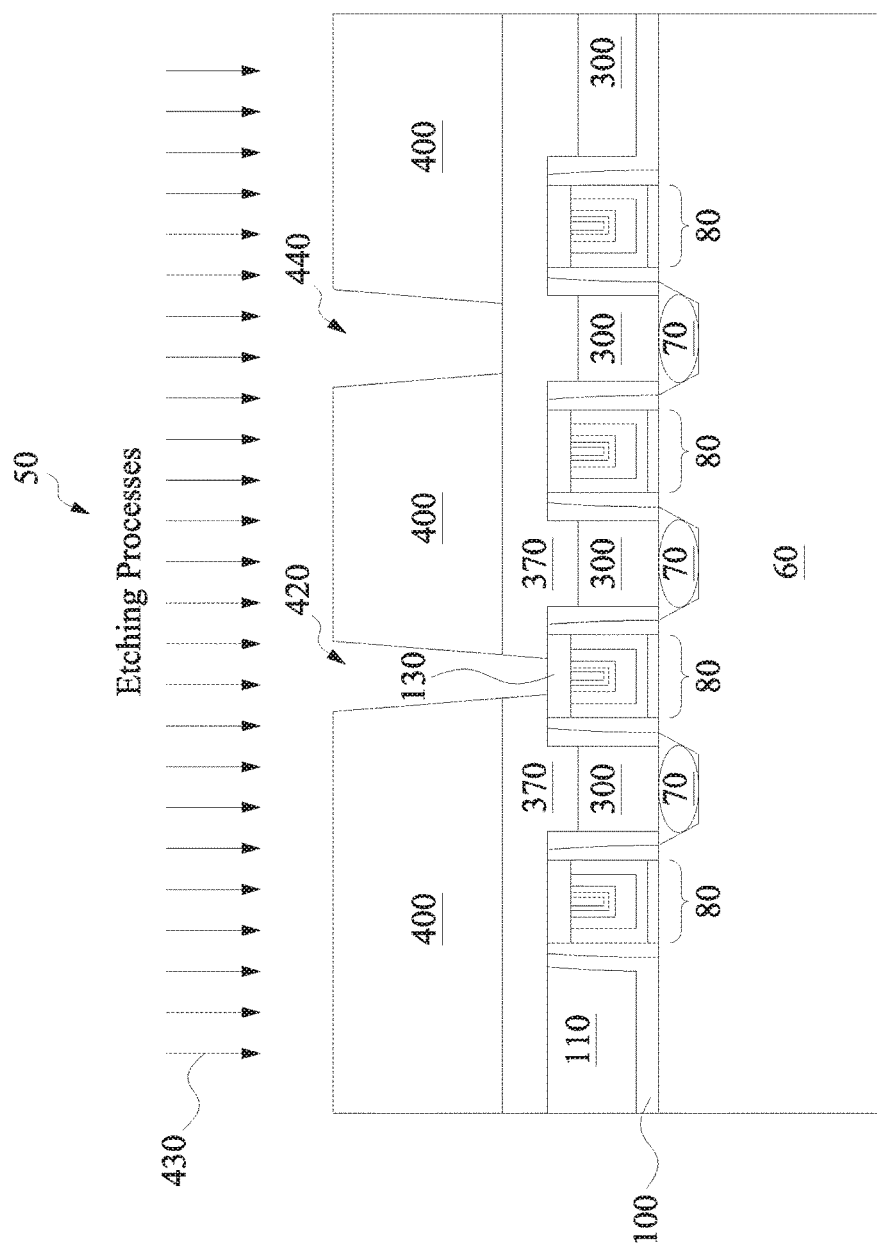

Referring now to FIG. 15, another etching process 430 is performed to form an opening 440 between two of the adjacent HKMG structures 80. In other words, the opening 440 is formed above one of the source/drains 70. The opening 440 extends through the ILD layer 400 but stops at the metal oxide layer 370. In other words, the metal oxide layer 370 serves as an etching-stop layer in this fabrication step. This fabrication step may also be referred to as a VD patterning step (for patterning a conductive via/contact for the source/drain).

Figure 16:
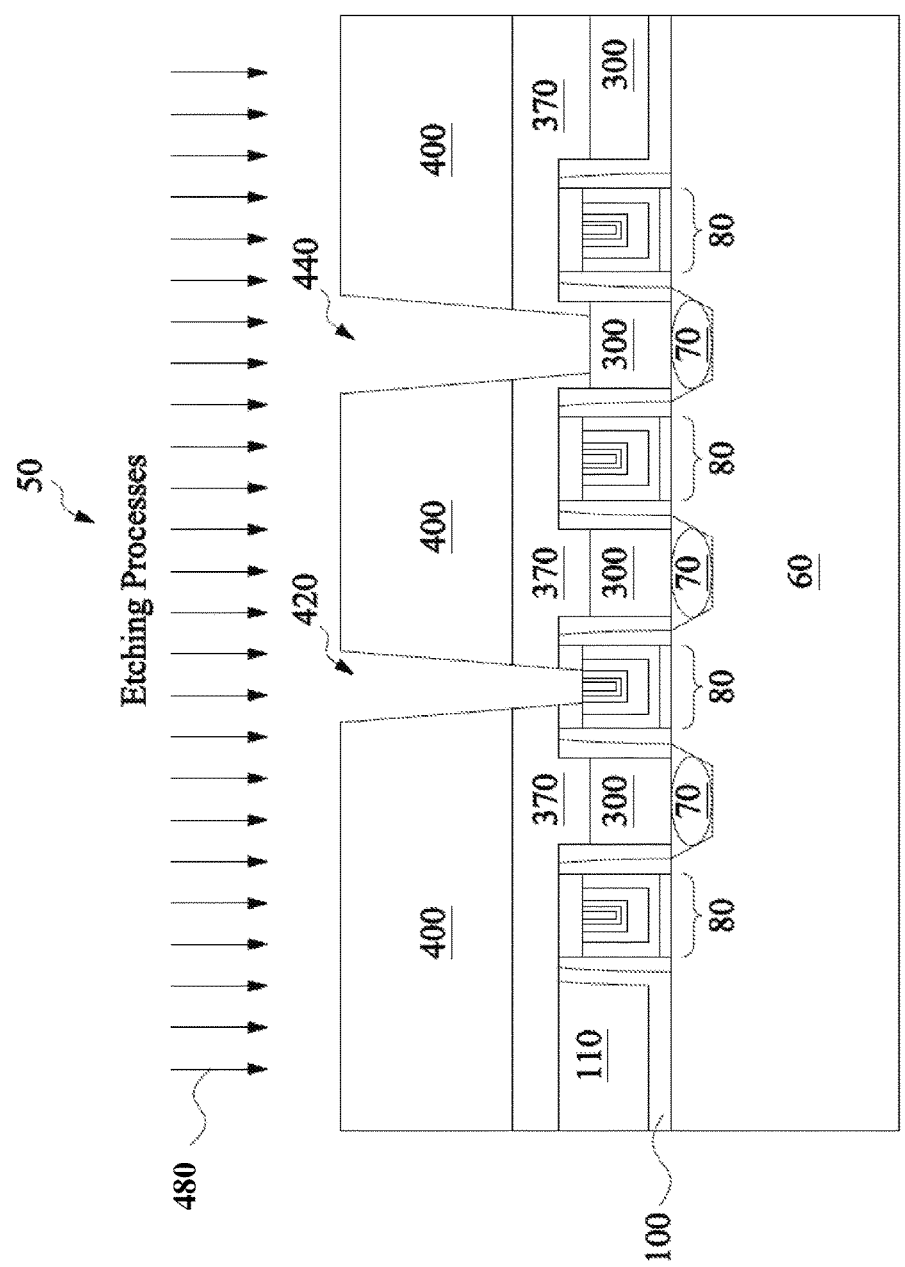

Referring now to FIG. 16, additional etching processes 480 are performed to further extend the openings 420 and 440 downwards. The portion of the dielectric material 130 exposed by the opening 420 is etched away, so the opening 420 now extends through the dielectric layer 130, thereby exposing the HKMG structure 80. The portion of the metal oxide layer 370 exposed by the opening 440 is also etched away, so the opening 440 now extends through the metal oxide layer 370, thereby exposing the conductive material 300.

Figure 17:
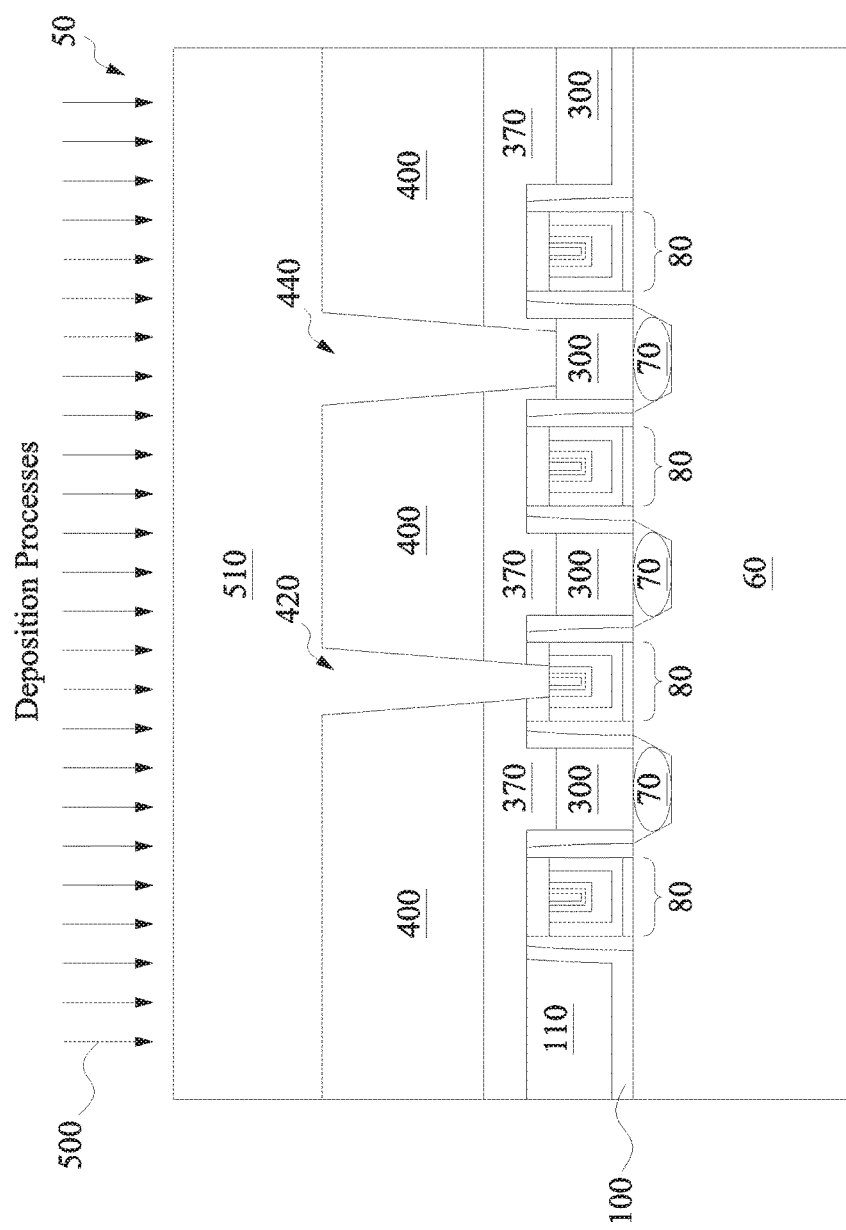

Referring now to FIG. 17, a deposition process 500 is performed to form a conductive material 510 over the ILD layer 400. The conductive material 510 is also formed to fill the openings 420 and 440. Therefore, the conductive material 510 is in physical and electrical contact with the gate structure 80 (previously exposed by the opening 420) and with the conductive material 300 (previously exposed by the opening 440). In some embodiments, the conductive material 510 contains cobalt. In some other embodiments, the conductive material 510 may contain tungsten or ruthenium.

Figure 18:
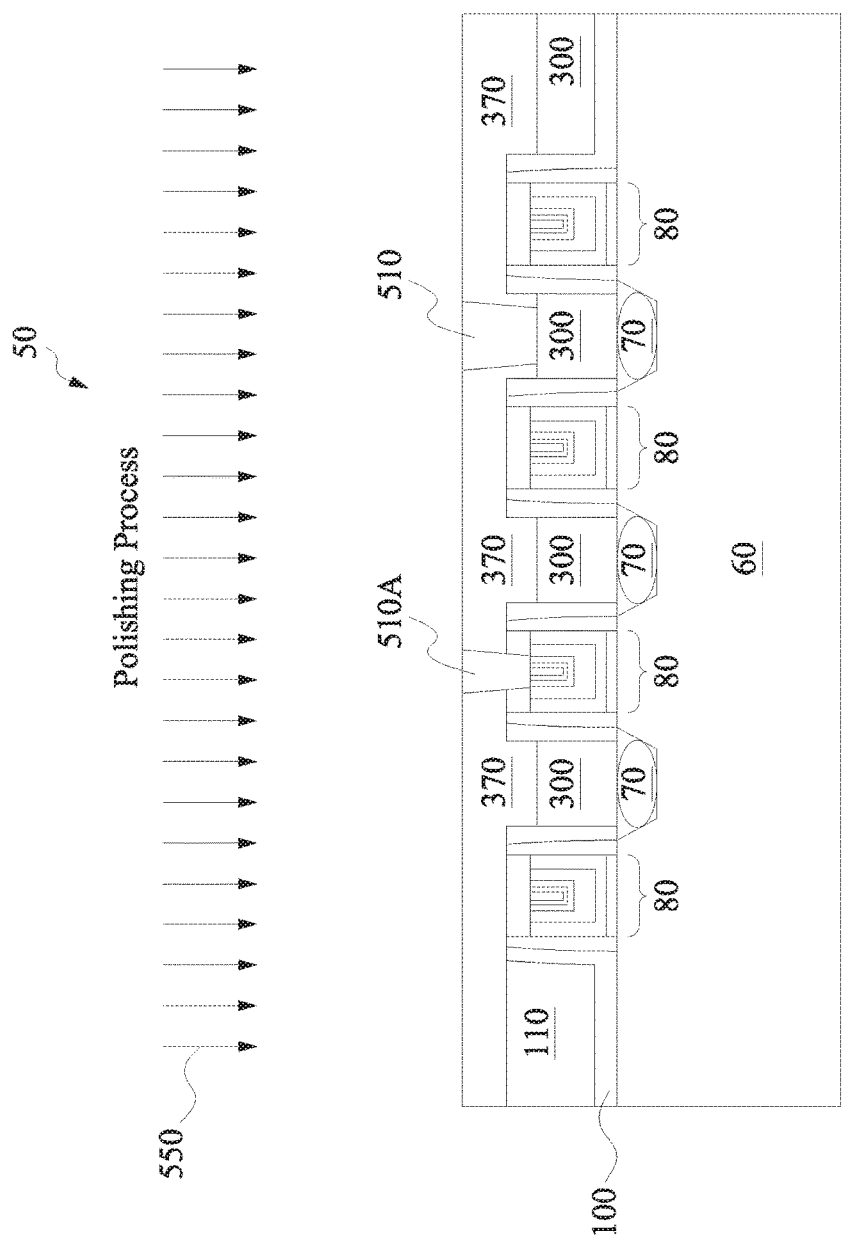

Referring now to FIG. 18, a polishing process 550 may be performed to remove excess portions of the conductive material 510 and the ILD layer 400 and to planarize the surface of a remaining portion of the conductive material 510. As a result, conductive contacts 510A and 510B are formed, which have coplanar surfaces with the metal oxide layer 370. The conductive contact 510A provides electrical connectivity to the HKMG structure 80 below, and the conductive contact 510B provides electrical connectivity to the source/drain 70 below.

Figure 19:
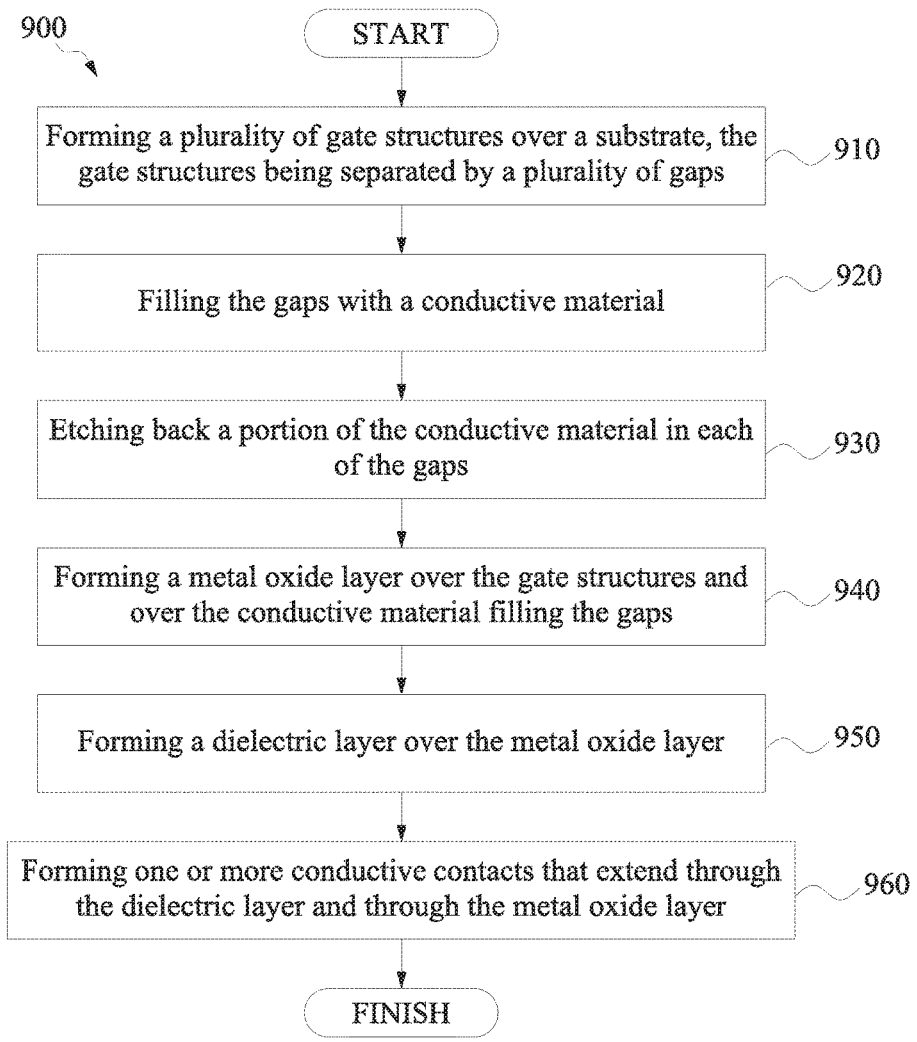
FIG. 19 is a flowchart illustrating a method of fabricating a semiconductor device in accordance with some embodiments of the present disclosure.

FIG. 19 is a flowchart of a method 900 of fabricating a semiconductor device according to various aspects of the present disclosure. One or more of the steps of the method 900 are performed as a part of a fabrication process for a semiconductor technology node that is a 5-nanometer technology node or smaller.

The method 900 includes a step 910 of forming a plurality of gate structures over a substrate. The gate structures are separated by a plurality of gaps. In some embodiments, the gate structures are high-k metal gate structures. In some embodiments, the gate structures are each formed to have a silicon nitride layer at an upper surface of the gate structure.

The method 900 includes a step 920 of filling the gaps with a conductive material. In some embodiments, the conductive material contains cobalt.

The method 900 includes a step 930 of etching back a portion of the conductive material in each of the gaps.

The method 900 includes a step 940 of forming a metal oxide layer over the gate structures and over the conductive material filling the gaps. In some embodiments, the forming of the metal oxide layer is performed using a spin-on deposition process. The spin-on deposition process is free of using an oxygen-containing gas. In some embodiments, the forming of the metal oxide layer comprises forming aluminum oxide, zirconium oxide, zinc oxide, tungsten oxide, tantalum oxide, titanium oxide, or hafnium oxide as the metal oxide material.

The method 900 includes a step 950 of forming a dielectric layer over the metal oxide layer. In some embodiments, the dielectric layer contains a low-k dielectric material and is formed as a part of an interlayer dielectric (ILD) layer. In some embodiments, the forming of the dielectric layer over the metal oxide layer is performed without polishing a surface of the metal oxide layer. In other words, the surface of the metal oxide layer need not be polished before the dielectric layer is formed on the surface of the metal oxide layer.

The method 900 includes a step 960 of forming one or more conductive contacts that extend through the dielectric layer and through the metal oxide layer. In some embodiments, the forming of the one or more conductive contacts includes etching an opening over the gate structure. The opening is etched through the silicon nitride layer. In some embodiments, the etching is configured to have different etching selectivity with respect to the metal oxide layer and the silicon nitride layer.

Based on the above discussions, it can be seen that the present disclosure offers advantages over conventional methods and devices of forming ILDs. It is understood, however, that other embodiments may offer additional advantages, and not all advantages are necessarily disclosed herein, and that no particular advantage is required for all embodiments. One advantage is that the spin-on metal oxide deposition is free of using an oxygen-containing gas, which reduces the risk of inadvertently oxidizing a metal material below. Another advantage is that the spin-on metal oxide deposition has better gap filling performance than the CVD and ALD methods used to form conventional ILD using a SiOC material. Therefore, no voids are trapped inside the metal oxide material, which would not have been true for the SiOC material. Yet another advantage is that a single fabrication process (spin-on metal oxide deposition) can be performed to replace 3 separate processes previously performed (SiOC deposition, CMP of SiOC, followed by a subsequent SiOC deposition). This leads to reduced fabrication cost and time. A further advantage is that the etching selectivity can be increased between the silicon nitride layer (located above the gate) and the metal oxide, compared to the silicon nitride layer and SiOC. This helps enlarge the process window.

One aspect of the present disclosure pertains to a method of fabricating a semiconductor device. A plurality of gate structures is formed over a substrate. The gate structures are separated by a plurality of gaps. The gaps are filled with a conductive material. A metal oxide layer is formed over the gate structures and over the conductive material filling the gaps. A dielectric layer is formed over the metal oxide layer. One or more conductive contacts are formed that extend through the dielectric layer and through the metal oxide layer.

Another aspect of the present disclosure pertains to a method of fabricating a semiconductor device. A plurality of high-k metal gate (HKMG) structures is formed over a substrate. The (HKMG) structures are separated by a plurality of gaps. The HKMG structures each include a first dielectric layer at an upper surface of the HKMG structure. The gaps are filled with a first conductive material. A portion of the first conductive material is removed in each of the gaps through an etching-back process. A metal oxide layer is formed using a spin-on deposition process. The metal oxide layer is formed over the (HKMG) structures and over the first conductive material. A second dielectric layer is formed over the metal oxide layer. An opening is etched in the second dielectric layer. The opening is etched through the second dielectric layer and through the metal oxide layer. The opening is filled with a second conductive material.

Yet another aspect of the present disclosure pertains to a semiconductor device. A plurality of gate structures is disposed over a substrate. The gate structures are separated by a plurality of gaps. A first dielectric material is disposed over the substrate and partially filling the gaps. A conductive material is disposed over the first dielectric material in each of the gaps. A metal oxide material is disposed over the conductive material.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   forming a plurality of gate structures over a substrate, the gate structures being separated by a plurality of gaps, wherein a dielectric component is formed at a top of each of the gate structures;
   filling the gaps with a conductive material;
   forming a metal oxide layer over the gate structures and over the conductive material filling the gaps, wherein the forming of the metal oxide layer is performed such that the metal oxide layer also partially fills in each of the gaps;
   forming a dielectric layer over the metal oxide layer;
   performing a first etching process to etch a first opening that is vertically aligned with a first gate structure of the plurality of gate structures, wherein the first opening extends through the dielectric layer and through the metal oxide layer, and wherein the dielectric component serves as a first etching-stop layer during the first etching process;
   performing a second etching process to etch a second opening that is vertically aligned with a portion of the conductive material filling the gaps, wherein the second opening extends through the dielectric layer but not through the metal oxide layer, and wherein the metal oxide layer serves as a second etching-stop layer during the second etching process;
   performing a third etching process to extend the first opening through the dielectric component and to extend the second opening through the metal oxide layer, thereby exposing the first gate structure with the first opening and exposing the portion of the conductive material with the second opening; and
   forming a first conductive contact in the first opening and a second conductive contact in the second opening.

2. The method of claim 1, wherein the forming of the metal oxide layer is performed using a spin-on deposition process.

3. The method of claim 2, wherein the spin-on deposition process is free of using an oxygen-containing gas.

4. The method of claim 3, wherein:
   the spin-on deposition process is performed with a spin in a range from about 500 revolutions per minute (RPM) to about 3000 RPM and for a duration in a range from about 20 seconds to about 200 seconds; and
   wherein the method further comprises performing a baking process after the spin-on deposition process, wherein the baking process is performed using air or $N_2$ and with a temperature in a range from about 50 degrees Celsius to about 400 degrees Celsius.

5. The method of claim 1, further comprising: after the filling but before the forming of the metal oxide layer, etching back a portion of the conductive material in each of the gaps, wherein the metal oxide layer is formed on the conductive material after the conductive material has been etched back.

6. The method of claim 1, wherein the forming of the metal oxide layer comprises forming aluminum oxide, zirconium oxide, zinc oxide, tungsten oxide, tantalum oxide, titanium oxide, or hafnium oxide as the metal oxide layer.

7. The method of claim 1, wherein the forming of the dielectric layer over the metal oxide layer is performed without polishing a surface of the metal oxide layer.

8. The method of claim 1, wherein the forming of the plurality of gate structures comprises forming high-k metal gate (HKMG) structures.

9. A method of fabricating a semiconductor device, comprising:
   forming a plurality of high-k metal gate (HKMG) structures over a substrate, wherein the HKMG structures are separated by a plurality of gaps, and wherein the HKMG structures each include a metal gate electrode and a first dielectric layer located over the metal gate electrode;
   filling the gaps with a first conductive material that contains cobalt;

removing a portion of the first conductive material between the HKMG structures in each of the gaps through a cobalt-etching-back process, wherein an upper surface of a remaining portion of the first conductive material is below an interface between the metal gate electrode and the first dielectric layer;

thereafter forming a metal oxide layer using a spin-on deposition process with a spin in a range from about 500 revolutions per minute (RPM) to about 3000 RPM and for a duration in a range from about 20 seconds to about 200 seconds, wherein the metal oxide layer is formed over the HKMG structures and over the remaining portion of the first conductive material;

forming a second dielectric layer over the metal oxide layer;

etching an opening in the second dielectric layer, wherein the opening is etched through the second dielectric layer and through the metal oxide layer; and filling the opening with a second conductive material.

10. The method of claim 9, further comprising: polishing the second dielectric layer and the second conductive material, thereby forming a conductive contact with a remaining portion of the second conductive material filling the opening.

11. The method of claim 9, wherein the spin-on deposition process is performed without using an oxygen-containing gas.

12. The method of claim 9, wherein the forming of the metal oxide layer comprises forming aluminum oxide, zirconium oxide, zinc oxide, tungsten oxide, tantalum oxide, titanium oxide, or hafnium oxide as the metal oxide layer.

13. The method of claim 9, wherein the forming of the second dielectric layer over the metal oxide layer is performed without polishing a surface of the metal oxide layer.

14. A method of fabricating a semiconductor device, comprising:

forming a plurality of gate structures over a substrate, the gate structures being separated by a plurality of gaps, wherein each of the gate structures includes a gate electrode and a mask layer formed over the gate electrode;

forming a first dielectric material over the substrate, the first dielectric material partially filling the gaps;

forming a conductive material on sidewalls of the first dielectric material in each of the gaps;

forming a metal oxide material over the conductive material, wherein the metal oxide material is partially formed in each of the gaps;

forming a dielectric layer over the metal oxide material; and forming, at least in part using a plurality of etching processes, a plurality of conductive contacts that each vertically extend through at least the dielectric layer and the metal oxide material, wherein the mask layer serves as an etching-stop layer for one of the etching processes, and wherein the metal oxide material serves as another etching-stop layer for another one of the etching processes.

15. The method of claim 14, wherein the plurality of etching processes include at least three etching processes.

16. The method of claim 14, wherein:

the forming the gate structures comprises forming a silicon nitride layer as the mask layer at an upper surface of each of the gate electrodes; and the forming of the conductive contacts comprises forming at least one of the conductive contacts that extends through the silicon nitride layer.

17. The method of claim 14, wherein the forming of the metal oxide material comprises forming a portion of the metal oxide material over the gate structures.

18. The method of claim 14, wherein the forming of the gate structures comprises forming a high-k gate dielectric and a metal gate electrode for each of the gate structures.

19. The method of claim 14, wherein the forming of the metal oxide material comprises forming the metal oxide material using a spin-on deposition process with a spin in a range from about 500 revolutions per minute (RPM) to about 3000 RPM and for a duration in a range from about 20 seconds to about 200 seconds.

20. The method of claim 14, wherein the forming of the conductive material comprises forming cobalt as the conductive material.

* * * * *